United States Patent
Mishima et al.

(10) Patent No.: US 9,944,827 B2
(45) Date of Patent: Apr. 17, 2018

(54) CMP POLISHING SOLUTION AND POLISHING METHOD

(75) Inventors: Kouji Mishima, Hitachi (JP);
Takafumi Sakurada, Hitachi (JP);
Tomokazu Shimada, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 353 days.

(21) Appl. No.: 13/172,397

(22) Filed: Jun. 29, 2011

(65) Prior Publication Data
US 2011/0318929 A1    Dec. 29, 2011

(30) Foreign Application Priority Data

Jun. 29, 2010  (JP) ................................ P2010-147660
May 27, 2011  (JP) ................................ P2011-119590

(51) Int. Cl.
*H01L 21/302* (2006.01)
*H01L 21/461* (2006.01)
(Continued)

(52) U.S. Cl.
CPC .............. *C09G 1/02* (2013.01); *C09K 3/1409* (2013.01); *H01L 21/3212* (2013.01); *H01L 21/7684* (2013.01)

(58) Field of Classification Search
USPC ........................................................ 438/692
See application file for complete search history.

(56) References Cited

U.S. PATENT DOCUMENTS 4,944,836 A    7/1990  Beyer et al.
6,565,619 B1 *  5/2003  Asano et al. ................... 51/308
(Continued)

FOREIGN PATENT DOCUMENTS

JP    02-278822 A    11/1990
JP    8-83780 A    3/1996
(Continued)

OTHER PUBLICATIONS

Japanese Notice of Allowance dated Oct. 23, 2012, issued in corresponding Japanese Patent Application No. 2011-119590, (2 pages). With Partial Translation.
(Continued)

*Primary Examiner* — Thomas Pham
(74) *Attorney, Agent, or Firm* — Westerman, Hattori, Daniels & Adrian, LLP

(57) ABSTRACT

The CMP polishing solution of the invention comprises (A) a metal corrosion inhibitor containing a compound with a 1,2,3-triazolo[4,5-b]pyridine skeleton, (B) an abrasive grain having a positive zeta potential in the CMP polishing solution, (C) a metal oxide solubilizer and (D) an oxidizing agent. The polishing method of the invention comprises a first polishing step in which the conductive substance layer of a substrate comprising an interlayer insulating filth having an elevated section and a trench at the surface, a barrier layer formed following the surface of the interlayer insulating film and the conductive substance layer formed covering the barrier layer, is polished to expose the barrier layer located on the elevated section of the interlayer insulating film, and a second polishing step in which the barrier layer exposed in the first polishing step is polished using the CMP polishing solution to expose the elevated section of the interlayer insulating film.

36 Claims, 3 Drawing Sheets

(51) Int. Cl.
 *C09K 13/00* (2006.01)
 *C03C 15/00* (2006.01)
 *C03C 25/68* (2006.01)
 *C09G 1/02* (2006.01)
 *C09K 3/14* (2006.01)
 *H01L 21/321* (2006.01)
 *H01L 21/768* (2006.01)

(56) References Cited

U.S. PATENT DOCUMENTS

| | | | |
|---|---|---|---|
| 2004/0072439 A1* | 4/2004 | Small et al. | 438/694 |
| 2004/0107650 A1* | 6/2004 | Siddiqui et al. | 51/307 |
| 2006/0030158 A1* | 2/2006 | Carter et al. | 438/692 |
| 2007/0224919 A1 | 9/2007 | Li et al. | |
| 2007/0251156 A1* | 11/2007 | Siddiqui | 51/307 |
| 2009/0133716 A1* | 5/2009 | Lee | 134/3 |
| 2010/0009540 A1* | 1/2010 | Kamiya et al. | 438/693 |
| 2010/0164106 A1* | 7/2010 | Lee et al. | 257/751 |

FOREIGN PATENT DOCUMENTS

| | | |
|---|---|---|
| JP | 2001-077062 A | 3/2001 |
| JP | 2004-031443 A | 1/2004 |
| JP | 2006-520530 A | 9/2006 |
| JP | 2008-270826 A | 11/2008 |
| JP | 2009-510723 A | 3/2009 |
| JP | 2009-530849 A | 8/2009 |
| JP | 2009-278061 A | 11/2009 |
| WO | 03/038883 A1 | 5/2003 |

OTHER PUBLICATIONS

Japanese Office Action dated Jun. 19, 2012, issued in corresponding Japanese Patent Application No. 2011-119590, (2 pages).

* cited by examiner

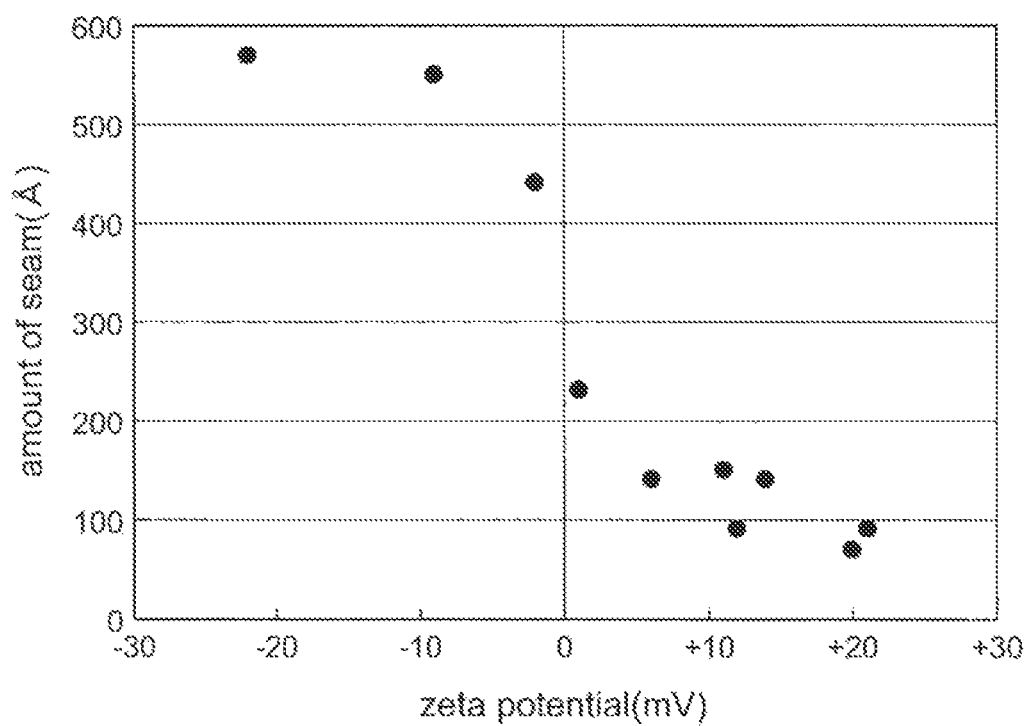

CMP POLISHING SOLUTION AND POLISHING METHOD

BACKGROUND OF THE INVENTION

Field of the Invention

The present invention relates to a CMP polishing solution and a polishing method, and more specifically, it relates to a CMP polishing solution and polishing method to be used for polishing of semiconductor devices in wiring formation steps and the like.

Related Background Art

New micromachining techniques are being developed in recent years for increasingly higher integration and higher performance of semiconductor integrated circuits (hereinafter referred to as "LSI"). Chemical mechanical polishing (hereunder, "CMP") is one such technique, which is widely used for flattening of interlayer insulating films, formation of metal plugs and formation of embedded wirings in LSI manufacturing steps, especially multilayer wiring formation steps. The technique is disclosed in U.S. Pat. No. 4,944,836, for example.

Recently, it has been attempted to utilize copper or copper alloys as conductive substances to serve as metals for wiring sections, in order to increase performance of LSIs. However, copper and copper alloys are poorly suitable for micromachining by dry etching, which has been often used for forming aluminum alloy wiring in the prior art.

The "damascene method" has therefore been primarily employed, wherein a thin-film of copper or copper alloy is accumulated on an insulating film (interlayer insulating film) having pre-formed concavities (trenches) and convexities (elevated sections) to embed the copper or copper alloy in the concavities, and then the thin-film accumulated on the convexities (the thin-film on sections other than the concavities) is removed by CMP to form embedded wiring. This technology is disclosed in Japanese Unexamined Patent Application Publication HEI No. 02-278822, for example.

Also, a layer comprising a conductor such as tantalum, tantalum alloy or tantalum nitride is formed at a lower layer of a wiring section metal such as copper or a copper alloy as a barrier conductive layer (hereunder referred to as "barrier layer") to prevent diffusion of the metal into the interlayer insulating film and to improve adhesiveness. The exposed barrier layer must be removed by CMP from the sections other than the wiring sections in which metals for wiring sections such as copper or copper alloy has been embedded. As the CMP polishing solutions used in such steps, the CMP polishing solution comprising hydroiodide ion and nitrogen-containing compounds have been proposed (see Japanese Patent Public Inspection No. 2009-530849, for example).

FIG. 1 is a schematic cross-sectional view showing a wiring formation in a common damascene process. As shown in FIG. 1(a), the substrate 100 before polishing comprises an interlayer insulating film 1 with convexo-concave composed of concavities and convexities formed at the surface, a barrier layer 2 formed following the surface convexo-concave of the interlayer insulating film 1, and a copper or copper alloy conductive substance layer (metal wiring) 3 accumulated to fill the convexo-concave.

Because the conductor used as the barrier layer 2 has higher hardness than copper or copper alloy, using a CMP polishing solution comprising a polishing material for copper or copper alloy does not provide a sufficient polishing speed for the conductor, and the flatness of the polished surface is often poor. In wiring formation by the damascene process, therefore, it is common to employ a polishing method having a two-stage polishing step comprising a first polishing step in which the conductive substance layer 3 is polished and a second polishing step in which the barrier layer 2 is polished.

Specifically, at first, as shown in FIG. 1(b), the conductive substance layer 3 is polished with a polishing solution for metal wiring polishing until the barrier layer 2 on the convexities of the interlayer insulating film 1 are exposed, as the first polishing step. Next, as shown in FIG. 1(c), the barrier layer 2 is polished with a polishing solution for the barrier layer until the convexities of the interlayer insulating film 1 are exposed, as the second polishing step, to obtain a polished substrate 200.

The polishing method in the second polishing step in which the barrier layer 2 is polished has primarily been a method of polishing removal of the barrier layer 2 alone, but in recent years there has been a shift toward methods of polishing portions of the interlayer insulating film 1 in addition to the barrier layer 2, in order to improve the flatness of the polished surface.

In such cases, the interlayer insulating film 1, barrier layer 2 and conductive substance layer 3 are all present at the surface to be polished and they must be polished simultaneously, and therefore the composition of the CMP polishing solution must be designed in consideration of balance between the polishing speeds for each of the layer substances at the surface to be polished. For example, if the polishing speed for the conductive substance layer 3 is too high, the conductive substance layer 3 will be removed in an amount greater than the barrier layer 2 and interlayer insulating film 1, resulting in poor flatness of the polished surface upon completion of polishing. Also, if the polishing speed for the interlayer insulating film 1 is slow, the relative polishing speed for the conductive substance layer 3 becomes too high, likewise resulting in poor flatness of the polished surface. In light of these problems there have been proposed CMP polishing solutions with added organic solvents or surfactants to reduce the polishing speed ratio between the interlayer insulating film 1, barrier layer 2 and conductive substance layer 3 (see International Patent Publication No. WO03/038883, for example).

Incidentally, one effective method of increasing the polishing speed for CMP is to add a metal oxide solubilizer to the CMP polishing solution. However, using a metal oxide solubilizer promotes etching of the metal wiring and generates a phenomenon in which the surface center sections of the embedded metal wiring are depressed like dishes after polishing (hereunder referred to as "dishing"), thereby impairing the flattening effect.

In order to prevent this phenomenon, methods of using CMP polishing solutions containing benzotriazoles as metal corrosion inhibitors have been proposed (see International Patent Publication No. WO03/038883 and Japanese Unexamined Patent Application Publication HEI No. 08-083780, for example). There have also been proposed CMP polishing solutions employing specific imidazoles, pyrazoles, thiazoles, triazoles or guanidines in addition to benzotriazoles in order to improve flatness (see Japanese Unexamined Patent Application Publication No. 2008-270826, for example).

SUMMARY OF THE INVENTION

Incidentally, another major technical problem in the second polishing step in which the barrier layer 2 is polished, in addition to reducing dishing, is how to reduce generation of seams. Generation of seams will now be explained with reference to FIG. 2, which is a magnified view of the dashed line region 4 in FIG. 1. The shape (surface location) after completion of the second polishing step is ideally the shape represented by region 6 indicated by the dashed line. During polishing of the barrier layer 2, however, in addition to the dishing caused by excess shaving of the conductive substance layer 3, local scoop-like removal of the interlayer insulating film 1 occurs near the conductive substance layer 3, thus creating a seam 5.

Generation of seams lead to problems such as increased wiring resistance. In recent years, since scaling of wirings has continued to advance with becoming multilayer wiring structures of LSIs, and the wiring cross-sectional areas have decreased and the film thicknesses of interconnect insulating films have become smaller, generation of seams is becoming a notable problem. With conventional CMP polishing solutions, however, it is not always easy to reduce generation of seams.

In addition, while the benzotriazoles commonly used as conventional metal corrosion inhibitors are highly effective for preventing dishing and improving flatness, it has been found that post-cleaning residue of organic materials on the wafer after polishing (organic residue) may be produced. This organic residue can be reduced by using CMP polishing solutions with high cleanability or by washing the cleaning solution, but even further reduction in organic residue has been desired in recent years.

It is an object of the present invention to solve these problems by providing a CMP polishing solution and polishing method that can reduce generation of seams while also reducing production of organic residue.

This invention has been accomplished upon finding that seam generation and organic residue production can be reduced by using a CMP polishing solution employing both a metal corrosion inhibitor comprising a compound with a 1,2,3-triazolo[4,5-b]pyridine skeleton, and an abrasive grain having a positive zeta potential in the CMP polishing solution.

Specifically, the invention relates to a CMP polishing solution comprising (A) a metal corrosion inhibitor containing a compound with a 1,2,3-triazolo[4,5-b]pyridine skeleton, (B) an abrasive grain having a positive zeta potential in the CMP polishing solution, (C) a metal oxide solubilizer and (D) an oxidizing agent.

With the CMP polishing solution of the invention it is possible to reduce generation of seams and production of organic residue. In particular, the CMP polishing solution of the invention can reduce generation of seams and production of organic residue on a substrate after the second polishing step of polishing the barrier layer. The CMP polishing solution of the invention can also inhibit both dishing and seams.

The component (A) is preferably at least one compound selected from among 1-acetyl-1H-1,2,3-triazolo[4,5-b]pyridine, 1H-1,2,3-triazolo[4,5-b]pyridine and 3H-1,2,3-triazolo[4,5-b]pyridin-3-ol, and more preferably it is at least one compound selected from among 1-acetyl-1H-1,2,3-triazolo[4,5-b]pyridine and 1H-1,2,3-triazolo[4,5-b]pyridine.

The content of the component (A) is preferably 0.001-10 parts by mass with respect to 100 parts by mass of the CMP polishing solution. This will allow polishing of the barrier layer while further reducing generation of seams.

The zeta potential of the component (B) is preferably at least +1 mV. This will allow generation of seams to be further reduced.

The component (C) is preferably at least one compound selected from among organic acids, organic acid esters, organic acid ammonium salts, inorganic acids and inorganic acid ammonium salts. This will allow a practical polishing speed to be maintained while effectively limiting the etching speed.

The (D) oxidizing agent is preferably at least one compound selected from among hydrogen peroxide, periodic acid salts, persulfuric acid salts, hypochlorous acid salts and ozone water. This will allow roughness of the polished surface to be minimized while obtaining a satisfactory polishing speed for the barrier layer.

The CMP polishing solution of the invention may further comprise (E) a water-soluble polymer. This will allow roughness of the polished surface to be minimized. From the same viewpoint, the component (E) is preferably at least one compound selected from among polycarboxylic acids, polycarboxylic acid salts, polycarboxylic acid esters, polysaccharides and vinyl-based polymers.

The CMP polishing solution of the invention may still further comprise (F) an organic solvent. This will tend to improve the wettability of the CMP polishing solution for the surface to be polished, while improving the polishing speed. From the viewpoint of improving the wettability for interlayer insulating films in particular, the component (F) is preferably at least one compound selected from among carbonic acid esters, lactones, glycols and glycol derivatives, ethers, alcohols, ketones, phenols, amides and sulfolanes.

The invention further relates to a polishing method comprising a first polishing step in which a conductive substance layer of a substrate comprising an interlayer insulating film having an elevated section and a trench at a surface, a barrier layer formed following the surface of the interlayer insulating film and the conductive substance layer formed covering the barrier layer, is polished to expose the barrier layer located on the elevated section of the interlayer insulating film, and a second polishing step in which the barrier layer exposed in the first polishing step is polished using the CMP polishing solution to expose the elevated section of the interlayer insulating film. With this polishing method of the invention, it is possible to reduce generation of seams and production of organic residue.

The interlayer insulating film may be at least one film selected from among silicon-based coating films and organic polymer films. The conductive substance layer preferably comprises at least one compound selected from among copper, copper alloys, copper oxides and copper alloy oxides. The barrier layer preferably comprises at least one compound selected from among tungsten compounds, tantalum compounds, titanium compounds, ruthenium compounds and cobalt compounds, and more preferably it comprises a tantalum compound.

According to the invention, it is possible to provide a CMP polishing solution and a polishing method that can reduce generation of seams while also reducing production of organic residue. Also according to the invention, it is possible to provide a CMP polishing solution and a polishing method that can reduce generation of seams while also reducing production of organic residue, particularly on the substrate after the second polishing step in which the barrier layer is polished. Furthermore, according to the invention, it is possible to provide a polishing method for production of highly reliable, low-cost semiconductor devices with excellent micronization, film thickness reduction and dimensional precision, using the CMP polishing solution.

BRIEF DESCRIPTION OF THE DRAWINGS

FIG. 3 is a graph showing the relationship between abrasive grain zeta potential and amount of seam.

DESCRIPTION OF THE PREFERRED EMBODIMENTS

Figure 1:
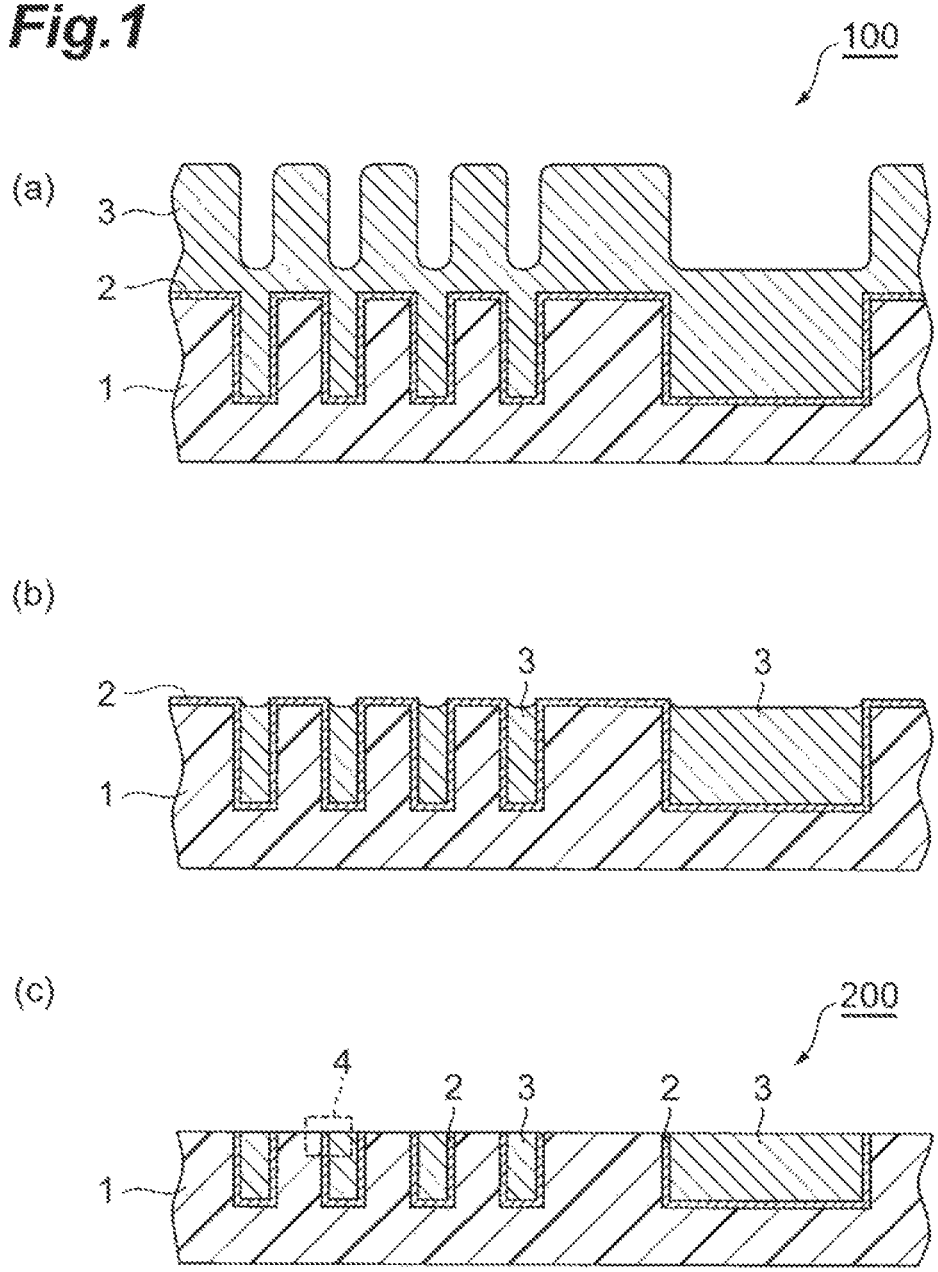
FIG. 1 is a schematic cross-sectional view showing a wiring formation in a damascene process.
Figure 2:
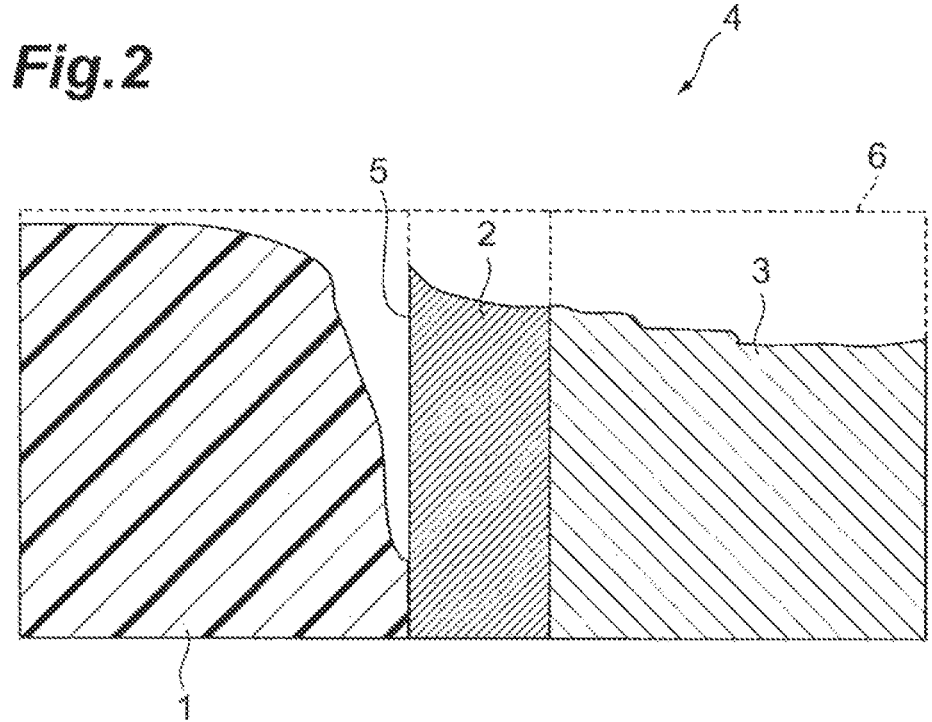
FIG. 2 is a schematic cross-sectional magnified view of a specific part of the substrate surface shown in FIG. 1.

Embodiments of the invention will now be explained in detail. The CMP polishing solution of this embodiment comprises at least component (A): a metal corrosion inhibitor containing a compound with a 1,2,3-triazolo[4,5-b]pyridine skeleton, component (B): an abrasive grain having a positive zeta potential in the CMP polishing solution, component (C): a metal oxide solubilizer and component (D): an oxidizing agent.

With the CMP polishing solution of this embodiment it is possible to reduce generation of seams and production of organic residue. The present inventors conjecture as follows in regard to the mechanism by which generation of seams is reduced using the CMP polishing solution of this embodiment.

Specifically, the present inventors conjecture that the mechanism of seam generation is due to maldistribution of the abrasive particles (abrasive grains). When numerous abrasive particles are adsorbed onto metal wiring, the abrasive particle concentration on the interlayer insulating film is increased near the metal wiring, while the abrasive particle concentration on the interlayer insulating film decreases at areas away from the metal wiring. As a result, the polishing speed for the interlayer insulating film is significantly affected by the metal wiring and seams are generated by differences in local polishing volume of the interlayer insulating film.

Since the compound with a 1,2,3-triazolo[4,5-b]pyridine skeleton as the metal corrosion inhibitor in the CMP polishing solution of this embodiment includes many nitrogen atoms with lone electron pairs, the compound is suitable for orientation on the metal wiring, and a dense three-dimensional metal corrosion-preventing film is formed on the metal wiring. Although the details are not fully understood at the current time, it is presumed that a dense three-dimensional metal corrosion-preventing film increases the repulsion effect between the metal corrosion-preventing film and the abrasive particles, thereby reducing maldistribution of the abrasive particles, as a result, the polishing speed of the interlayer insulating film becomes constant despite the metal wiring, thereby reducing generation of seams.

In addition, it has been found experimentally that metal wiring contacting with a CMP polishing solution comprising a compound with a 1,2,3-triazolo[4,5-b]pyridine skeleton as the metal corrosion inhibitor has a positive zeta potential. In this case, using an abrasive grain having a positive zeta potential in the CMP polishing solution of this embodiment presumably places the metal wiring and abrasive particles in a state of repulsion of potentials, resulting in increased uniformity of the abrasive particle concentration on the metal wiring and interlayer insulating film, thereby resulting in even more equal polishing amount at each section of the interlayer insulating film. As mentioned above, generation of seams can be reduced if the CMP polishing solution of this embodiment employs both a compound with a 1,2,3-triazolo[4,5-b]pyridine skeleton and abrasive particles having a positive zeta potential in the CMP polishing solution.

The components in the CMP polishing solution of this embodiment will now be described in detail.

[Component (A): Metal Corrosion Inhibitor]

The CMP polishing solution of this embodiment comprises a compound with a 1,2,3-triazolo[4,5-b]pyridine skeleton as the metal corrosion inhibitor. Examples of component (A) include one or more compounds selected from among:
1H-1,2,3-triazolo[4,5-b]pyridine,
1-acetyl-1H-1,2,3-triazolo[4,5-b]pyridine,
3H-1,2,3-triazolo[4,5-b]pyridine,
1H-1,2,3-triazolo[4,5-b]pyridin-1-ol,
3H-1,2,3-triazolo[4,5-b]pyridin-3-ol,
1,2-dihydro-3H-1,2,3-triazolo[4,5-b]pyridin-3-ol,
7-methyl-1H-1,2,3-triazolo[4,5-b]pyridine,
6-methyl-3H-1,2,3-triazolo[4,5-b]pyridine,
5-methyl-1H-1,2,3-triazolo[4,5-b]pyridine,
3,5-diphenyl-3H-1,2,3-triazolo[4,5-b]pyridine,
3,5-diphenyl-6-methyl-3H-1,2,3-triazolo[4,5-b]pyridine,
3-phenyl-5-ethyl-6-methyl-3H-1,2,3-triazolo[4,5-b]pyridine, and
3H-1,2,3-triazolo[4,5-b]pyridin-3-yl acetate. These compounds may be dissolved or dispersed in the CMP polishing solution using water or any of the organic solvents mentioned below. These compounds may be used alone or in mixtures of two or more.

Component (A) is preferably a compound with a skeleton represented by general formula (1) or general formula (2) below in the molecule. This will allow generation of seams to be effectively reduced.

[Chemical Formula 1]

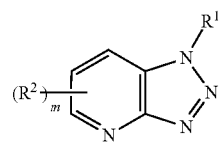

(1)

[In formula (1), $R^1$ represents hydrogen atom or a monovalent organic group, $R^2$ represents a monovalent organic group, and m represents an integer of 0-3. When m is 2-3, the multiple $R^2$ groups may be the same or different.]

[Chemical Formula 2]

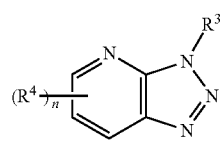

(2)

[In formula (2), $R^3$ represents hydrogen atom or a monovalent organic group, $R^4$ represents a monovalent organic group, and n represents an integer of 0-3. When n is 2-3, the multiple $R^4$ groups may be the same or different.]

Specific examples of organic groups for substituent $R^1$ in general formula (1) and substituent $R^3$ in general formula (2) include hydroxyl group, acetyl group, phenyl group and organic acid groups (for example, acetate group ($CH_3CO_2$)). Specific examples of organic groups for substituent $R^2$ in general formula (1) and substituent $R^4$ in general formula (2) include alkyl groups and phenyl group. Preferred alkyl groups are methyl group and ethyl group.

In general formula (1), substituent $R^1$ is preferably hydrogen atom or an acetyl group, and m is preferably 0. In general formula (2), substituent $R^3$ is preferably a hydroxyl group, and n is preferably 0.

Among the compounds mentioned above, compounds with a skeleton represented by general formula (1) in the molecule include 1H-1,2,3-triazolo[4,5-b]pyridine, 1-acetyl-1H-1,2,3-triazolo[4,5-b]pyridine, 1H-1,2,3-triazolo[4,5-b]pyridin-1-ol, 7-methyl-1H-1,2,3-triazolo[4,5-b]pyridine and 5-methyl-1H-1,2,3-triazolo[4,5-b]pyridine. Also, compounds with a skeleton represented by general formula (2) in the molecule include 3H-1,2,3-triazolo[4,5-b]pyridine, 3H-1,2,3-triazolo[4,5-b]pyridin-3-ol, 6-methyl-3H-1,2,3-triazolo[4,5-b]pyridine, 3,5-diphenyl-3H-1,2,3-triazolo[4,5-b]pyridine, 3,5-diphenyl-6-methyl-3H-1,2,3-triazolo[4,5-b]pyridine, 3-phenyl-5-ethyl-6-methyl-3H-1,2,3-triazolo[4,5-b]pyridine and 3H-1,2,3-triazolo[4,5-b]pyridin-3-yl acetate.

Component (A) is preferably at least one compound selected from among 1-acetyl-1H-1,2,3-triazolo[4,5-b]pyridine, 1H-1,2,3-triazolo[4,5-b]pyridine and 3H-1,2,3-triazolo[4,5-b]pyridin-3-ol, and more preferably at least one compound selected from among 1-acetyl-1H-1,2,3-triazolo[4,5-b]pyridine and 1H-1,2,3-triazolo[4,5-b]pyridine, from the viewpoint of allowing polishing of the barrier layer while effectively reducing generation of seams.

A compound comprising a reactive substituent such as a hydroxyl group or acetyl group may be used as the compound with a 1,2,3-triazolo[4,5-b]pyridine skeleton. Specific examples of such compounds include 1H-1,2,3-triazolo[4,5-b]pyridin-1-ol, 1-acetyl-1H-1,2,3-triazolo[4,5-b]pyridine, 3H-1,2,3-triazolo[4,5-b]pyridin-3-ol and 1,2-dihydro-3H-1,2,3-triazolo[4,5-b]pyridin-3-ol.

Among the compounds with 1,2,3-triazolo[4,5-b]pyridine skeletons, compounds that do not have hydrophobic substituents (for example, alkyl groups such as methyl group or ethyl group), such as 1H-1,2,3-triazolo[4,5-b]pyridine and 1-acetyl-1H-1,2,3-triazolo[4,5-b]pyridine, also exhibit effects of further preventing organic residue at the wafer surface after polishing and cleaning, and of significantly reducing the number of defects. The metal wiring and metal corrosion inhibitor undergo chemical reaction to form a metal complex (metal corrosion-preventing film), but if the solubility of the reaction product in water is high, the number of defects will be significantly reduced without generating organic residue at the wafer surface after cleaning. In other words, by selecting a metal corrosion inhibitor so that the reaction product with the metal wiring is water-soluble, it is possible to further reduce organic residue. In this regard, benzotriazole as the conventionally known metal corrosion inhibitor, whose reaction product with metal wirings have low solubility in water, potentially produce large amounts of organic residue. Thus, the CMP polishing solution of this embodiment preferably contains no benzotriazole. However, although non-hydrophobic substituents are more likely to be able to reduce production of organic residue, there is no limitation thereto. Even if the compound with a 1,2,3-triazolo[4,5-b]pyridine skeleton includes a hydrophobic substituent, the organic residue can be adequately reduced if the solubility of the reaction product of the metal wiring and metal corrosion inhibitor in water is high, in the polishing solution state.

The compound with a 1,2,3-triazolo[4,5-b]pyridine skeleton may be combined with other metal corrosion inhibitor in the CMP polishing solution of this embodiment. Such other metal corrosion inhibitors are preferably metal corrosion inhibitors of types such that the reaction products of the mixed metal corrosion inhibitor and metal wiring are water-soluble, in order to maintain an organic residue-reducing effect. Examples of metal corrosion inhibitors of types such that the reaction product of the metal corrosion inhibitor and metal wiring are water-soluble include 4-aminopyridine, 4-hydroxypyridine, 2-aminopyrazine, 2-picolineamide, pyrazineamide, 2-aminopyrazine, 6-amino-2-picoline, 3-methyl-5-pyrazolone, 3-amino-5-methylpyrazole, hexamethylenetetramine, 1,2,4-triazolo[4,3-a]pyridine-3(2H)-one, 4-hydroxymethyl-5-methylimidazole, 1-hydroxybenzotriazole, 1-(formamidemethyl)-1H-benzotriazole, 1,3,5-triazine, 3-amino-5,6-dimethyl-1,2,4-triazine, adenine and aminoguanidine.

The content of the metal corrosion inhibitor is preferably 0.001 part by mass or greater, more preferably 0.005 part by mass or greater, even more preferably 0.01 part by mass or greater and especially preferably 0.025 part by mass or greater, with respect to 100 parts by mass of the CMP polishing solution, from the viewpoint of tending to facilitate inhibition of the etching of the wiring section metal and minimizing roughness of the polished surface. The content of the metal corrosion inhibitor is preferably not greater than 10 parts by mass, more preferably not greater than 5 parts by mass and even more preferably not greater than 2 parts by mass with respect to 100 parts by mass of the CMP polishing solution, from the viewpoint of tending to limit reduction in the polishing speed for the wiring section metal and the barrier layer metal.

[Component (B): Abrasive Grain]

The abrasive grain in the CMP polishing solution of this embodiment has a positive zeta potential in the CMP polishing solution.

The zeta potential of the abrasive grain in the CMP polishing solution is preferably +1 mV or greater, more preferably +5 mV or greater and even more preferably +8 mV or greater, from the viewpoint of further reducing generation of seams. The upper limit for the zeta potential is not particularly restricted but may be about +30 mV. The zeta potential of the abrasive grain can be easily adjusted using generally available commercial abrasive grain having a positive charge.

The zeta potential of the abrasive grain in the CMP polishing solution can be measured using, for example, the Zetasizer 3000 HS by Spectris Co., Ltd. More specifically, the CMP polishing solution is diluted with water to the scattered light quantity recommended by the Zetasizer 3000 HS, and measurement is performed at room temperature.

There is no particular restrictions on the abrasive grain, but the abrasive grain is preferably at least one type selected from among silica, alumina, zirconia, ceria, titania, germania and modified forms of these grains. The abrasive grain may be used alone or in mixtures of two or more.

The modified forms include silica, alumina, zirconia, ceria, titania, germania or the like modified with alkyl groups on the surfaces of the abrasive grains. The method of modifying the surface of the abrasive grain with alkyl groups is not particularly restricted, and examples include a method of reacting the hydroxyl group on the surface of the abrasive grain with the alkyl groups of an alkoxysilane. The alkoxysilane with alkyl groups is not particularly restricted and may be monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane, trimethylmonoethoxysilane or the like. The reaction method is also not particularly restricted, and for example, the abrasive grain may be reacted with the alkoxysilane in the polishing solution at room temperature or while heating as desired.

The mean particle size of the abrasive grains is preferably not greater than 200 nm and more preferably not greater than 100 nm, from the viewpoint of satisfactory dispersion stability in the CMP polishing solution and low level of polishing damage (scratches) produced by CMP. The lower limit for the mean particle size is not particularly restricted and may be about 5 nm, for example. Among such abrasive grains, colloidal silica or colloidal alumina with a mean particle size of not greater than 200 nm is preferred, and colloidal silica or colloidal alumina with a mean particle size of not greater than 100 nm is more preferred, from the viewpoint of more satisfactory dispersion stability in CMP polishing solutions and lower level of polishing damage by CMP. The mean particle size can be measured using an optical diffraction scattering particle size distribution meter and the like (for example, COULTER N4 SD by Coulter Electronics).

From the viewpoint of excellent polishing speed for the conductive substance layer, barrier layer and interlayer insulating film, the abrasive grain is preferably aggregated particles in which an average of less than 2 primary particles are aggregated, and more preferably aggregated particles in which an average of less than 1.2 primary particles are aggregated. The standard deviation of the mean particle size distribution of the abrasive grain is preferably not greater than 10 nm and more preferably not greater than 5 nm.

From the viewpoint of tending to limit reduction in polishing speed, the content of the abrasive grain is preferably 0.01 part by mass or greater, more preferably 0.02 part by mass or greater, even more preferably 0.05 part by mass or greater, especially preferably 0.10 part by mass or greater and extremely preferably 0.20 part by mass or greater, with respect to the 100 parts by mass of the CMP polishing solution. The content of the abrasive grain is preferably not greater than 50 parts by mass, more preferably not greater than 30 parts by mass and even more preferably not greater than 20 parts by mass with respect to 100 parts by mass of the CMP polishing solution, from the viewpoint of tending to limit polishing damage.

[Component (C): Metal Oxide Solubilizer]

The CMP polishing solution of this embodiment comprises a metal oxide solubilizer. There are no particular restrictions on the metal oxide solubilizer, and it may be organic acids, organic acid esters, organic acid ammonium salts, inorganic acids, inorganic acid ammonium salts, or the like. Examples of metal oxide solubilizers include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glycerinic acid, oxalic acid, malonic acid, succinic acid, glutaric acid, adipic acid, pimelic acid, maleic acid, phthalic acid, malic acid, tartaric acid, citric acid and p-toluenesulfonic acid; esters of these organic acids and ammonium salts of the organic acids; inorganic acids such as hydrochloric acid, sulfuric acid, nitric acid and chromic acid; and inorganic acid ammonium salts such as ammonium persulfate, ammonium nitrate, ammonium chloride, ammonium bichromate and ammonium dichromate. Preferred among these are formic acid, malonic acid, malic acid, tartaric acid, citric acid, salicylic acid and adipic acid or the like, from the viewpoint of maintaining a practical polishing speed while effectively limiting the etching speed. Any of these metal oxide solubilizers may be used alone or in mixtures of two or more.

The content of the metal oxide solubilizer is preferably 0.001 part by mass or greater, more preferably 0.002 part by mass or greater and even more preferably 0.005 part by mass or greater, with respect to 100 parts by mass of the CMP polishing solution, from the viewpoint of tending to limit reduction in the polishing speed of the conductive substance layer and barrier layer. The content of the metal oxide solubilizer is preferably not greater than 20 parts by mass, more preferably not greater than 10 parts by mass and even more preferably not greater than 5 parts by mass, with respect to 100 parts by mass of the CMP polishing solution, from the viewpoint of tending to more easily inhibit etching and tending to inhibit roughness of the polished surface.

[Component (D): Oxidizing Agent]

The CMP polishing solution of this embodiment comprises an oxidizing agent. There are no particular restrictions on the oxidizing agent, and examples include hydrogen peroxide, periodic acid salts such as potassium periodate, persulfuric acid salts (peroxosulfuric acid salts) such as potassium persulfate, hypochlorous acid salts such as potassium hypochlorite, and ozone water, among which hydrogen peroxide is preferred. Any of the oxidizing agents may be used alone or in mixtures of two or more. When the target substrate is a silicon substrate containing elements for an integrated circuit, contamination by alkali metals, alkaline earth metals, halides and the like is undesirable, and therefore an oxidizing agent that does not contain non-volatilizing components is preferred. However, when the target substrate is a glass substrate containing no semiconductor element, an oxidizing agent containing non-volatilizing components may be used.

The content of the oxidizing agent is preferably 0.01-50 parts by mass with respect to 100 parts by mass of the CMP polishing solution. From the viewpoint of tending to sufficiently oxidizing the metal and to improve polishing speed, the lower limit for the content of the oxidizing agent is preferably 0.01 part by mass or greater, more preferably 0.02 part by mass or greater and even more preferably 0.05 part by mass or greater. From the viewpoint of tending to limit roughness of the polished surface, the upper limit for the content of the oxidizing agent is preferably not greater than 50 parts by mass, more preferably not greater than 30 parts by mass and even more preferably not greater than 15 parts by mass. From the viewpoint of tending to increase the polishing speed for conductive substance layers, the upper limit for the content of the oxidizing agent is especially preferably not greater than 10 parts by mass, greatly preferably not greater than 5 parts by mass, and extremely preferably not greater than 2 parts by mass.

[Component (E): Water-Soluble Polymer]

The CMP polishing solution of this embodiment may further comprise (E) a water-soluble polymer. The weight-average molecular weight (Mw) of the water-soluble polymer is preferably 500 or greater, more preferably 1500 or greater and even more preferably 5000 or greater. There is no particular restriction on the upper limit of the weight-average molecular weight of the water-soluble polymer, but it is preferably not greater than 5 million from the viewpoint of solubility. A high polishing speed will tend to be obtained if the weight-average molecular weight of the water-soluble polymer is at least 500. The weight-average molecular weight of the water-soluble polymer may be measured by gel permeation chromatography using a calibration curve based on standard polystyrene, under the following conditions.
(Conditions)
Sample amount: 10 μL
Standard polystyrene: Standard polystyrene by Tosoh Corp. (molecular weights: 190000, 17900, 9100, 2980, 578, 474, 370, 266)
Detector: RI-monitor by Hitachi, Ltd., trade name "L-3000"
Integrator: GPC integrator by Hitachi, Ltd., trade name "D-2200"
Pump: Trade name "L-6000" by Hitachi, Ltd.
Degassing apparatus: Trade name "Shodex DEGAS" by Showa Denko K.K.
Columns: Trade names "GL-R440", "GL-R430" and "GL-R420" by Hitachi Chemical Co., Ltd., linked in that order.
Eluent: Tetrahydrofuran (THF)
Measuring temperature: 23° C.
Flow rate: 1.75 mL/min
Measuring time: 45 minutes There are no particular restrictions on the water-soluble polymer, and it may be a polycarboxylic acid, polycarboxylic acid salt, polycarboxylic acid ester, polysaccharide, vinyl-based polymer or the like, and more specifically, for example, a polycarboxylic acid such as polyaspartic acid, polyglutamic acid, polylysine, polymalic acid, polymethacrylic acid, polyamic acid, polymaleic acid, polyitaconic acid, polyfumaric acid, poly(p-styrenecarboxylic acid), polyacrylic acid, polyacrylamide, aminopolyacrylamide or polyglyoxylic acid; a polycarboxylic acid salt such as ammonium polymethacrylate salt, sodium polymethacrylate salt, ammonium polyacrylate salt, sodium polyacrylate salt, polyamic acid ammonium salt or polyamic acid sodium salt; a polycarboxylic acid ester such as polyaspartic acid ester, polyglutamic acid ester, polymethacrylic acid ester, polyamic acid ester, polymaleic acid ester, polyfumaric acid ester or polyacrylic acid ester; a polysaccharide such as alginic acid, pectic acid, carboxymethylcellulose, agar, curdlan or pullulan; or a vinyl-based polymer such as polyvinyl alcohol, polyvinylpyrrolidone or polyacrolein. Among these, polymalic acid, polymethacrylic acid, polyacrylic acid, their esters and ammonium salts, and polyacrylamide, pectic acid, agar, polyvinyl alcohol and polyvinylpyrrolidone, are preferred.

Acrylic acid-based polymers are preferred as water-soluble polymer from the viewpoint of excellent flattening properties. An acrylic acid-based polymer is defined as a polymer obtained by copolymerizing a starting compound comprising a compound with a C=C—COOH skeleton as a monomer component. Specific examples of monomer components for obtaining acrylic acid-based polymers include carboxylic acids such as acrylic acid, methacrylic acid, crotonic acid, vinylacetic acid, tiglic acid, 2-trifluoromethylacrylic acid, itaconic acid, fumaric acid, maleic acid, citraconic acid, mesaconic acid and gluconic acid; sulfonic acids such as 2-acrylamide-2-methylpropanesulfonic acid; and esters such as methyl acrylate, butyl acrylate, methyl methacrylate and butyl methacrylate; as well as their salts such as ammonium salts, alkali metal salts and alkylamine salts. Methacrylic acid-based polymers (polymers obtained by copolymerizing starting monomers comprising methacrylic acid as a monomer component) are preferred among the above. These methacrylic acid-based polymers are preferably at least one type selected from among homopolymers of methacrylic acid, and copolymers of methacrylic acid with monomers that are copolymerizable with methacrylic acid. The water-soluble polymer may be used alone or in mixtures of two or more However, when the substrate to which the CMP polishing solution of this embodiment is applied is a silicon substrate for a semiconductor integrated circuit, contamination by alkali metals, alkaline earth metals or halides is undesirable. For this reason, the water-soluble polymer preferably contains no alkali metals, alkaline earth metals or halides. This restriction does not apply, however, when the target substrate is a glass substrate or the like containing no semiconductor element.

The content of the water-soluble polymer is preferably 0.001 part by mass or greater, more preferably 0.002 part by mass or greater and even more preferably 0.005 part by mass or greater, with respect to 100 parts by mass of the CMP polishing solution, from the viewpoint of tending to prevent generation of roughness of the polished surface. The content of the water-soluble polymer is preferably not greater than 15 parts by mass, more preferably not greater than 10 parts by mass and even more preferably not greater than 5 parts by mass, with respect to 100 parts by mass of the CMP polishing solution, from the viewpoint of tending to improve the stability of the abrasive grain in the CMP polishing solution.

[Component (F): Organic Solvent]

The CMP polishing solution of this embodiment may further comprise (F) an organic solvent. The organic solvent is not particularly restricted, but it is preferably solvent that can be optionally mixed with water. The organic solvent is preferably at least one type selected from among carbonic acid esters, lactones, glycols and glycol derivatives, ethers, alcohols, ketones, phenols, amides and sulfolanes.

Specific examples of organic solvent include: carbonic acid esters such as ethylene carbonate, propylene carbonate, dimethyl carbonate, diethyl carbonate and methylethyl carbonate; lactones such as butyrolactone and propiolactone; glycols such as ethylene glycol, propylene glycol, diethylene glycol, dipropylene glycol, triethylene glycol and tripropylene glycol; glycol derivatives including glycol monoethers such as ethyleneglycol monomethyl ether, propyleneglycol monomethyl ether, diethyleneglycol monomethyl ether, dipropyleneglycol monomethyl ether, triethyleneglycol monomethyl ether, tripropyleneglycol monomethyl ether, ethyleneglycol monoethyl ether, propyleneglycol monoethyl ether, diethyleneglycol monoethyl ether, dipropyleneglycol monoethyl ether, triethyleneglycol monoethyl ether, tripropyleneglycol monoethyl ether, ethyleneglycol monopropyl ether, propyleneglycol monopropyl ether, diethyleneglycol monopropyl ether, dipropyleneglycol monopropyl ether, triethyleneglycol monopropyl ether, tripropyleneglycol monopropyl ether, ethyleneglycol monobutyl ether, propyleneglycol monobutyl ether, diethyleneglycol monobutyl ether, dipropyleneglycol monobutyl ether, triethyleneglycol monobutyl ether and tripropyleneglycol monobutyl ether, and glycol diethers such as ethyleneglycol dimethyl ether, propyleneglycol dimethyl ether, diethyleneglycol dimethyl ether, dipropyleneglycol dimethyl ether, triethyleneglycol dimethyl ether, tripropyleneglycol dimethyl ether, ethyleneglycol diethyl ether, propyleneglycol diethyl ether, diethyleneglycol diethyl ether, dipropyleneglycol diethyl ether, triethyleneglycol diethyl ether, tripropyleneglycol diethyl ether, ethyleneglycol dipropyl ether, propyleneglycol dipropyl ether, diethyleneglycol dipropyl ether, dipropyleneglycol dipropyl ether, triethyleneglycol dipropyl ether, tripropyleneglycol dipropyl ether, ethyleneglycol dibutyl ether, propyleneglycol dibutyl ether, diethyleneglycol dibutyl ether, dipropyleneglycol dibutyl ether, triethyleneglycol dibutyl ether and tripropyleneglycol dibutyl ether; ethers such as tetrahydrofuran, dioxane, dimethoxyethane, polyethylene oxide, ethyleneglycol monomethyl acetate, diethyleneglycol monoethyl ether acetate and propyleneglycol monomethyl ether acetate; alcohols such as methanol, ethanol, propanol, n-butanol, n-pentanol, n-hexanol and isopropanol (isopropyl alcohol); ketones such as acetone and methyl ethyl ketone; and phenols such as phenol, amides such as dimethylformamide; n-methylpyrrolidone; ethyl lactate and sulfolanes such as sulfolane. Preferred among these are glycol monoethers, alcohols and carbonic acid esters. The organic solvent may be used alone or in mixtures of two or more.

The content of the organic solvent is preferably 0.1 part by mass or greater, more preferably 0.2 part by mass or greater and even more preferably 0.5 part by mass or greater, with respect to 100 parts by mass of the CMP polishing solution, from the viewpoint of tending to prevent loss of wettability of the polishing solution for the substrate. The content of the organic solvent is preferably not greater than 50 parts by mass, more preferably not greater than 30 parts by mass and even more preferably not greater than 20 parts by mass, with respect to 100 parts by mass of the CMP polishing solution, from the viewpoint of tending to prevent reduction in dispersibility.

The CMP polishing solution may contain water, and the content of the water may be the remainder after the removal of the aforementioned components.

(pH)

The pH of the CMP polishing solution of this embodiment is preferably 1-12 and more preferably 1-6, from the viewpoint of increasing the CMP polishing speed for the wiring metal layer or barrier layer. If the pH is 1-6, it will be easier to ensure the prescribed polishing speed by CMP so that the CMP polishing solution will be more practical. The pH is more preferably 1-4 from the viewpoint of the zeta potential and stability of the abrasive grain, and it is especially preferably 2-4 from the viewpoint of safety. However, since a higher pH will tend to promote formation of a complex by the metal corrosion inhibitor and metal, the pH is preferably 6-12 from the viewpoint of increasing the effect of the metal corrosion inhibitor, although the pH is not restricted so long as a practical polishing speed can be achieved. The pH of the CMP polishing solution can be measured with a pH meter (for example, a Model pH81 by Yokogawa Electric Corp.). The measured pH value that is used may be obtained by placing an electrode in the CMP polishing solution after 2-point calibration using, standard buffer (phthalate pH buffer: pH 4.01 (25° C.), neutral phosphate pH buffer: pH 6.86 (25° C.)), and measuring the value upon stabilization after an elapse of 2 minutes or more.

[Storage Method]

The CMP polishing solution of this embodiment may be stored as a single CMP polishing solution comprising all of the components, or each of the components may be prepared in different solutions and mixed to their prescribed concentrations immediately before polishing. Depending on the components, their mixture beforehand can impair the stability or cause aggregation of the abrasive grains, but this can be avoided by storing them as different solutions in this manner. For example, an aqueous solution of the (D) oxidizing agent and a slurry comprising the other components may be separated into two solutions, and when hydrogen peroxide is used as the (D) oxidizing agent, from the standpoint of stability it is preferred to store and transport as two solutions, i.e. a hydrogen peroxide aqueous solution and a slurry comprising the other components, and it is preferred to mix them immediately before use.

The single CMP polishing solution or the two solutions mentioned above may be concentrated for the purpose of facilitating storage and transport, or allowing the amount of each component to be adjusted as necessary for use. There are no particular restrictions on the concentration rate, but it is preferably about 2- to 10-fold for the advantage of concentration and to ensure a concentration that does not cause precipitation of the components.

[Polishing Method]

The CMP polishing solution of this embodiment can be used for formation of a wiring layer in a semiconductor device. The CMP polishing solution of this embodiment may be used, for example, for CMP of a substrate comprising a conductive substance layer, a barrier layer and an interlayer insulating film. The substrate comprises, for example, an interlayer insulating film having convexities (elevated sections) and concavities (trenches) at the surface, a barrier layer formed following the surface of the interlayer insulating film, and a conductive substance layer formed covering the barrier layer. The polishing speed ratio for the conductive substance layer/barrier layer/interlayer insulating film in CMP under the same conditions is preferably 0.1-2/1/0.1-2.

The interlayer insulating film may be at least one film selected from among silicon-based coating films and organic polymer films. Examples of the silicon-based coating films include silica-based coating films containing silicon dioxide, fluorosilicate glass, organosilicate glass obtained using trimethylsilane or dimethoxydimethylsilane as starting materials, silicon oxynitride, silsesquioxane hydride or the like, and silicon carbide films and silicon nitride films. Examples of the organic polymer films include wholly aromatic low permittivity interlayer insulating films. Silicon dioxide films are particularly preferred among those films mentioned above. Such films can be formed by CVD, spin coating, dip coating or spray methods. Specific examples of interlayer insulating films include interlayer insulating films in LSI manufacturing steps, especially multilayer wiring formation steps.

Constituent materials of conductive substance layers include substances composed mainly of copper compounds such as copper, copper alloys, copper oxide or copper alloy oxides, tungsten compounds such as tungsten or tungsten alloys, or metals such as silver or gold, among which there are preferred substances composed mainly of copper compounds such as copper, copper alloys, copper oxide and copper alloy oxides. The conductive substance layer used may be a film formed from such substances by a known sputtering or plating method.

The barrier layer is formed to prevent diffusion of the conductive substance into the interlayer insulating film, and to improve the adhesiveness between the interlayer insulating film and conductive substance. The barrier layer preferably comprises a tungsten compound such as tungsten, tungsten nitride or tungsten alloy, a titanium compound such as titanium, titanium nitride or titanium alloy, a tantalum compound such as tantalum, tantalum nitride or tantalum alloy, a ruthenium compound such as ruthenium, ruthenium nitride or ruthenium alloy or a cobalt compound such as cobalt, cobalt nitride or cobalt alloy, and more preferably it comprises a tantalum compound. The barrier layer may have a single-layer structure comprising one of these, or it may have a built-up structure comprising two or more layers.

In the case of polishing with an abrasive cloth, for example, the polishing apparatus used may be a common polishing apparatus having a holder capable of holding the substrate to be polished, and a polishing platen that is connected to a motor or the like with variable rotational speed and that can mount the abrasive cloth. There are no particular restrictions on the abrasive cloth, and a common nonwoven fabric, foamed polyurethane, porous fluorine resin or the like may be used.

The polishing conditions are not restricted, but the rotational speed of the polishing platen is preferably low, at not higher than 200 rpm, to prevent fly off of the substrate. The pressure with which the substrate (for example, the semiconductor substrate) having the surface to be polished is pressed against the abrasive cloth is preferably 1-100 kPa, and it is more preferably 2-50 kPa to satisfy the conditions of uniformity of polishing speed within the surface to be polished, and flatness of the pattern. The CMP polishing solution of this embodiment is preferably provided continuously to the abrasive cloth by a pump or the like during polishing. The amount supplied is not restricted, but preferably the surface of the abrasive cloth is covered by the polishing solution at all times.

Upon completion of polishing, preferably, the substrate is thoroughly rinsed in running water, and the substrate is dried after removing the water droplets adhering to the substrate by spin drying or the like. More preferably, the substrate is dried after carrying out a known washing process, which a brush made of polyurethane is pressed against the substrate at a fixed pressure while rotating the brush, as a commercially available cleaning solution is poured onto the substrate surface, for removal of the adhering substances on the substrate.

For chemical mechanical polishing with a consistent surface condition of the abrasive cloth, it is preferred to include an abrasive cloth-conditioning step before polishing. For example, the abrasive cloth is conditioned with a solution containing at least water, using a dresser with diamond particles. The polishing method of this embodiment is preferably followed by an additional substrate washing step.

The polishing method of this embodiment is characterized by comprising a first polishing step in which the conductive substance layer of a substrate comprising an interlayer insulating film having convexities (elevated section) and concavities (trenches) at the surface, a barrier layer formed following the surface of the interlayer insulating film and a conductive substance layer formed covering the barrier layer, is polished to expose the barrier layer located on the convexities of the interlayer insulating film, and a second polishing step in which the barrier layer exposed in the first polishing step is polished using the CMP polishing solution of this embodiment to expose the convexities of the interlayer insulating film. The conductive substance layer may also cover the barrier layer so as to fill the concavities of the interlayer insulating film.

The polishing method of this embodiment can be suitably used in the second polishing step in which the barrier layer is polished, and it can reduce the generation of erosion and seam at metal wiring sections.

The polishing method of this embodiment will now be explained using an example of formation of a wiring layer in a semiconductor device.

First, an interlayer insulating film of silicon dioxide or the like is layered onto a silicon substrate. Next, concavities (exposed portions of the substrate) are formed in a prescribed pattern at the surface of the interlayer insulating film by known means such as resist layer formation and etching, to obtain an interlayer insulating film having convexities and concavities. A barrier layer of tantalum or the like is formed on the interlayer insulating film by vapor deposition or CVD, to obtain a barrier layer covering the interlayer insulating film along the convexo-concave at the surface. Also, a conductive substance layer of copper or the like is formed by vapor deposition, plating or CVD so as to fill the concavities and cover the barrier layer. The thickness of the interlayer insulating film at the substrate obtained in this manner is preferably about 0.01-2.0 µm, the thickness of the barrier layer is preferably about 0.01-1.0 µm, and the thickness of the conductive substance layer is preferably about 0.01-3.0 µm.

Next, the conductive substance layer at the surface of the substrate is polished by CMP using a conductive substance polishing solution having a sufficiently high polishing speed for the conductive substance layer/barrier layer (first polishing step). As a result, the barrier layer located on the convexities of the interlayer insulating film is exposed at the surface, to obtain the desired conductor pattern where the conductive substance layer remains in the concavities. As polishing proceeds, portions of the barrier layer located above the convexities of the interlayer insulating film may be simultaneously polished with the conductive substance layer. The pattern surface obtained by the first polishing step may be used as the surface to be polished for the second polishing step, for polishing using the CMP polishing solution of this embodiment.

In the second polishing step, the barrier layer exposed by the first polishing step is polished by relative movement between a polishing platen and the obtained substrate with the surface to be polished of the substrate pressed against the abrasive cloth, while supplying the CMP polishing solution of this embodiment between the abrasive cloth and the surface to be polished. The CMP polishing solution of this embodiment can be used to polish the conductive substance layer, barrier layer and interlayer insulating film, at least the exposed barrier layer is polished in the second polishing step.

The polishing is completed at the point when the convexities of the interlayer insulating film which was covered with the barrier layer are all exposed and the conductive substance layer remains in the concavities as the wiring layer, to yield the desired pattern with the cross-section of the barrier layer exposed at the borders between the convexities and concavities.

In order to ensure more excellent flatness upon completion of polishing, overpolishing may be performed for polishing to a depth that includes some of the convexities of the interlayer insulating film. For example, when the time until the desired pattern is obtained in the second polishing step is 100 seconds, and additional polishing is performed for 50 seconds after the 100 seconds of polishing, this is referred to as "50% overpolishing".

As interlayer insulating film and second metal wiring later are formed on the metal wiring formed in this manner and an interlayer insulating film is again formed between and on the wiring, and then polishing is performed to obtain a smooth surface across the entire semiconductor substrate. By repeating this step a prescribed number of times, it is possible to produce a semiconductor device having the desired number of wiring layers.

The CMP polishing solution of the invention can be used not only for polishing of a metal film formed at a semiconductor substrate as described above, but also for polishing of a substrate such as a magnetic head.

EXAMPLES

The invention will now be explained in greater detail by examples, with the understanding that the invention is not

17 limited to these examples so long as the technical concept of the invention is maintained. For example, the types of materials and their content ratios in the polishing solution may be types and ratios other than those used in the examples, and the compositions and structures of the polishing target may also be compositions and structures other than those used in the examples.

Metal Corrosion Inhibitor and Amount of Seam

Example 1

[Preparation of CMP Polishing Solution (1)]

After adding 0.1 part by mass of 1H-1,2,3-triazolo[4,5-b]pyridine, 0.5 part by mass of malic acid, 0.5 part by mass of 30% hydrogen peroxide water, 0.1 part by mass of polymethacrylic acid (weight-average molecular weight: 8000) and 3.0 parts by mass of isopropyl alcohol to 70.8 parts by mass of water, the mixture was stirred and mixed. Also, 25.0 parts by mass of commercially available colloidal silica (nonvolatile content (NV): 20 mass %, corresponding to 5 parts by mass as silica) having a mean particle size of 60 nm and a zeta potential of about 10 mV was added to the mixture, and the mixture was stirred and mixed to prepare CMP polishing solution (1).

Examples 2-6

[Preparation of CMP Polishing Solutions (2)-(6)]

CMP polishing solutions (2)-(6) were prepared by the same procedure as Example 1, by mixing the components listed in Table 1.

Comparative Example 1

[Preparation of CMP Polishing Solution (7)]

After adding 0.1 part by mass of 2-aminopyridine, 0.5 part by mass of malonic acid, 0.5 part by mass of 30% hydrogen peroxide water, 0.1 part by mass of polymethacrylic acid (weight-average molecular weight: 8000) and 3.0 parts by mass of isopropyl alcohol to 70.8 parts by mass of water, the mixture was stirred and mixed. Also, 25.0 parts by mass of commercially available colloidal silica (nonvolatile content (NV): 20 mass %, corresponding to 5.0 parts by mass as silica) having a mean particle size of 60 nm and a zeta potential of about 10 mV was added to the mixture, and the mixture was stirred and mixed to prepare CMP polishing solution (7).

Comparative Examples 2-12

[Preparation of CMP Polishing Solutions (8)-(18)]

CMP polishing solutions (8)-(18) were prepared by the same procedure as Comparative Example 1, by mixing the components listed in Tables 2 and 3.

[Evaluation of CMP Polishing Solutions (1)-(18)]

(Measurement of pH)

The pH of each of the CMP polishing solutions (1)-(18) was measured using a pH meter (Model pH81, product of Yokogawa Electric Corp.). As a result, the pH of the CMP polishing solutions (1)-(18) were all within the range of 2-4.

(Evaluation of Zeta Potential)

The zeta potentials of the abrasive grains in CMP polishing solutions (1)-(18) were measured using a Zetasizer 3000 HS by Spectris Co., Ltd. As a result, the zeta potentials of CMP polishing solutions (1)-(18) were 8 mV-13 mV.

18

(Preparation of Patterned Substrate)

The copper film at sections other than the concavities (trenches) of a copper wiring-attached patterned substrate having a 12-inch (30.5 cm) diameter (φ) (754 CMP pattern by ATDF: 5000 angstrom-thick interlayer insulating film made of silicon dioxide, having a pattern with a 100 μm copper wiring width, 50% wiring density) were polished by a known CMP method using a copper film polishing solution, to expose the barrier layer on the convexities at the surface to be polished. The patterned substrate was cut into small 2 cm×2 cm pieces and used for the following polishing procedure. The barrier layer of the patterned substrate was a tantalum film with a thickness of 250 angstrom.

(Polishing Conditions)

Polishing apparatus: Small benchtop polishing machine (trade name: IMPTECH 10 DVT by Engis Corp.).

Abrasive cloth: Suede polyurethane wet foam type abrasive cloth.

Platen rotational speed: 90 rpm

Polishing pressure: 30 kPa

Polishing solution supply rate: 15 ml/min.

(Polishing of Substrate)

CMP polishing solutions (1)-(18) were used for chemical mechanical polishing of the patterned substrate for 80 seconds under the polishing conditions described above. In this polishing step, corresponding to the second polishing step described above, the convexities of the interlayer insulating film were all exposed at the surface to be polished at 20 seconds, and the surface to be polished including the exposed convexities of the interlayer insulating film was polished during the remaining 60 seconds.

(Evaluation of Amounts of Seam and Dishing)

The amount of seam and amount of dishing were evaluated under the following conditions to evaluate the flatness of the patterned substrate after polishing. Specifically, the shape of a section with a copper wiring width of 100 μm and a wiring density of 50% on the polished patterned substrate was examined by scanning with a contact profilometer (trade name: P-16•OF by KLA-Tencor). The results are shown in Tables 1 to 3.

Amount of seam: The amount of excess polishing of the interlayer insulating film edge near the copper wiring compared to the center section of the interlayer insulating film was measured as the amount of seam. An amount of seam of up to 250 angstrom was evaluated as a satisfactory result.

Amount of dishing: The step height between the copper wiring section and interlayer insulating film section was measured as the amount of dishing. An amount of dishing of less than 20 nm was evaluated as a satisfactory result, and is denoted as "A" in Tables 1-3.

(Evaluation of Polishing Amount)

The film thickness of an interlayer insulating film section (silicon dioxide film section) of the polished patterned substrate having a copper wiring width of 100 μm and a wiring density of 50% was measured with a benchtop light-interference film thickness measuring apparatus (trade name: NanoSpec5100 by Nanometrics), and the measured film thickness value was subtracted from the thickness of 5000 angstrom for the interlayer insulating film section of the patterned substrate before polishing, to obtain the polishing amount at the interlayer insulating film section. An interlayer insulating film section thickness of less than 5000 angstrom indicates that the barrier layer (tantalum film) with a thickness of 250 angstrom at the upper layer section had been removed: The measuring results for the polishing amount of the interlayer insulating film section ($SiO_2$ polishing amount) and the polishing amount of the barrier layer (Ta polishing amount) are shown in Tables 1-3.

TABLE 1

|  |  |  | Example |  |  |  |  |  |
|---|---|---|---|---|---|---|---|---|
|  |  |  | 1 | 2 | 3 | 4 | 5 | 6 |
| CMP Polishing solution |  |  | (1) | (2) | (3) | (4) | (5) | (6) |
| CMP Polishing solution composition (parts by mass) | Metal corrosion inhibitor | 1H-1,2,3-triazolo[4,5-b]pyridine | 0.1 | 0.1 | — | — | — | — |
|  |  | 3H-1,2,3-triazolo[4,5-b]pyridin-3-ol | — | — | 0.1 | 0.1 | — | — |
|  |  | 1-Acetyl-1H-1,2,3-triazolo[4,5-b]pyridine | — | — | — | — | 0.1 | 0.1 |
|  | Metal oxide solubilizer | Malic acid | 0.5 | — | — | 0.5 | 0.5 | — |
|  |  | Malonic acid | — | 0.5 | 0.5 | — | — | 0.5 |
|  | Oxidizer | 30% Hydrogen peroxide water | 0.5 | 0.5 | 0.5 | 0.5 | 0.5 | 0.5 |
|  | Abrasive particles | Colloidal silica (mean particle size 60 nm) | 5.0 | 5.0 | 5.0 | 5.0 | 5.0 | 5.0 |
|  | Water-soluble polymer | Polyacrylic acid (Mw: 60000) | — | 0.1 | — | 0.1 | 0.1 | — |
|  |  | Polymethacrylic acid (Mw: 8000) | 0.1 | — | 0.1 | — | — | 0.1 |
|  | Organic solvent | Isopropyl alcohol | 3.0 | — | 3.0 | — | — | 2.0 |
|  |  | Propyleneglycol monopropyl ether | — | 3.0 | — | 3.0 | 2.0 | — |
|  | Water |  | 90.8 | 90.8 | 90.8 | 90.8 | 91.8 | 91.8 |
| Evaluation results | Ta Polishing amount (Å) |  | 250 | 250 | 250 | 250 | 250 | 250 |
|  | $SiO_2$ Polishing amount (Å) |  | 924 | 914 | 878 | 882 | 1098 | 1017 |
|  | Amount of seam (Å) |  | 50 | 70 | 150 | 160 | 100 | 90 |
|  | Amount of dishing |  | A | A | A | A | A | A |

TABLE 2

|  |  |  | Comp. Ex. |  |  |  |  |  |
|---|---|---|---|---|---|---|---|---|
|  |  |  | 1 | 2 | 3 | 4 | 5 | 6 |
| CMP Polishing solution |  |  | (7) | (8) | (9) | (10) | (11) | (12) |
| CMP Polishing solution composition (parts by mass) | Metal corrosion inhibitor | 2-Aminopyridine | 0.1 | — | — | — | — | — |
|  |  | 4-Aminopyridine | — | 0.1 | — | — | — | — |
|  |  | Benzotriazole | — | — | 0.1 | — | — | — |
|  |  | 1-(Formamidemethyl)-1H-benzotriazole | — | — | — | 0.1 | — | — |
|  |  | 1-Hydroxybenzotriazole | — | — | — | — | 0.1 | — |
|  |  | 1,2,3-Triazole | — | — | — | — | — | 0.1 |
|  |  | 1,2,4-Triazole | — | — | — | — | — | — |
|  |  | 1,2,4-Triazolo[4,3-a]pyridin-3(2H)-one | — | — | — | — | — | — |
|  |  | Phthalazine | — | — | — | — | — | — |
|  |  | 3-Methyl-5-pyrazolone | — | — | — | — | — | — |
|  |  | 3-Amino-5-hydroxypyrazole | — | — | — | — | — | — |
|  |  | 4-Hydroxymethyl-5-methylimidazole | — | — | — | — | — | — |
|  | Metal oxide solubilizer | Malic acid | — | 0.5 | — | 0.5 | — | 0.5 |
|  |  | Malonic acid | 0.5 | — | 0.5 | — | 0.5 | — |
|  | Oxidizer | 30% Hydrogen peroxide water | 0.5 | 0.5 | 0.5 | 0.5 | 0.5 | 0.5 |
|  | Abrasive particles | Colloidal silica (mean particle size 60 nm) | 5.0 | 5.0 | 5.0 | 5.0 | 5.0 | 5.0 |
|  | Water-soluble polymer | Polyacrylic acid (Mw: 60000) | — | 0.1 | 0.1 | — | — | 0.1 |
|  |  | Polymethacrylic acid (Mw: 8000) | 0.1 | — | — | 0.1 | 0.1 | — |
|  | Organic solvent | Isopropyl alcohol | 3.0 | 3.0 | — | 3.0 | 3.0 | — |
|  |  | Propyleneglycol monopropyl ether | — | — | 2.0 | — | — | 2.0 |
|  | Water |  | 90.8 | 90.8 | 91.8 | 90.8 | 90.8 | 91.8 |
| Evaluation results | Ta Polishing amount (Å) |  | 250 | 250 | 250 | 250 | 250 | 250 |
|  | $SiO_2$ Polishing amount (Å) |  | 838 | 723 | 931 | 1017 | 789 | 558 |
|  | Amount of seam (Å) |  | 460 | 620 | 300 | 480 | 400 | 350 |
|  | Amount of dishing |  | A | A | A | A | A | A |

TABLE 3

|  |  |  | Comp. Ex. |  |  |  |  |  |
|---|---|---|---|---|---|---|---|---|
|  |  |  | 7 | 8 | 9 | 10 | 11 | 12 |
| CMP Polishing solution |  |  | (13) | (14) | (15) | (16) | (17) | (18) |
| CMP Polishing solution composition (parts by mass) | Metal corrosion inhibitor | 2-Aminopyridine | — | — | — | — | — | — |
|  |  | 4-Aminopyridine | — | — | — | — | — | — |
|  |  | Benzotriazole | — | — | — | — | — | — |
|  |  | 1-(Formamidemethyl)-1H-benzotriazole | — | — | — | — | — | — |
|  |  | 1-Hydroxybenzotriazole | — | — | — | — | — | — |
|  |  | 1,2,3-Triazole | — | — | — | — | — | — |
|  |  | 1,2,4-Triazole | 0.1 | — | — | — | — | — |
|  |  | 1,2,4-Triazolo[4,3-a]pyridin-3(2H)-one | — | 0.1 | — | — | — | — |
|  |  | Phthalazine | — | — | 0.1 | — | — | — |

TABLE 3-continued

|  |  |  | Comp. Ex. | | | | | |
|---|---|---|---|---|---|---|---|---|
|  |  |  | 7 | 8 | 9 | 10 | 11 | 12 |
|  |  | 3-Methyl-5-pyrazolone | — | — | — | 0.1 | — | — |
|  |  | 3-Amino-5-hydroxypyrazole | — | — | — | — | 0.1 | — |
|  |  | 4-Hydroxymethyl-5-methylimidazole | — | — | — | — | — | 0.1 |
|  | Metal oxide | Malic acid | — | 0.5 | — | 0.5 | — | 0.5 |
|  | solubilizer | Malonic acid | 0.5 | — | 0.5 | — | 0.5 | — |
|  | Oxidizer | 30% Hydrogen peroxide water | 0.5 | 0.5 | 0.5 | 0.5 | 0.5 | 0.5 |
|  | Abrasive particles | Colloidal silica (mean particle size 60 nm) | 5.0 | 5.0 | 5.0 | 5.0 | 5.0 | 5.0 |
|  | Water-soluble polymer | Polyacrylic acid (Mw: 60000) | — | 0.1 | 0.1 | — | — | 0.1 |
|  |  | Polymethacrylic acid (Mw: 8000) | 0.1 | — | — | 0.1 | 0.1 | — |
|  | Organic solvent | Isopropyl alcohol | 3.0 | 3.0 | — | 3.0 | 3.0 | — |
|  |  | Propyleneglycol monopropyl ether | — | — | 2.0 | — | — | 2.0 |
|  |  | Water | 90.8 | 90.8 | 91.8 | 90.8 | 90.8 | 91.8 |
| Evaluation results | Ta Polishing amount (Å) | | 250 | 250 | 250 | 250 | 250 | 250 |
|  | SiO$_2$ Polishing amount (Å) | | 644 | 1170 | 699 | 1070 | 836 | 1025 |
|  | Amount of seam (Å) | | 360 | 440 | 320 | 500 | 480 | 450 |
|  | Amount of dishing | | A | A | A | A | A | A |

As shown in Table 1, there was no problem with the amount of dishing with the CMP polishing solutions of Examples 1-6, wherein the metal corrosion inhibitor had a 1,2,3-triazolo[4,5-b]pyridine skeleton, and the amount of seam was also small at not greater than 160 angstrom. The polishing amount of the interlayer insulating film section was also sufficient, and therefore the CMP polishing solution may be considered practical.

In contrast, as shown in Tables 2 and 3, although the amount of dishing was not a problem with the CMP polishing solutions of Comparative Examples 1-12 wherein the metal corrosion inhibitor did not have a 1,2,3-triazolo[4,5-b]pyridine skeleton, the amount of seam was 300 angstrom or greater, which was about twice the amount with the CMP polishing solutions having a 1,2,3-triazolo[4,5-b]pyridine skeleton.

Abrasive Grains with Positive Zeta Potential, and Amount of Seam

Examples 7-14, Comparative Examples 13-15

The following examples show that an even greater effect of reducing amount of seam is obtained by using a metal corrosion inhibitor containing a compound with a 1,2,3-triazolo[4,5-b]pyridine skeleton together with abrasive grains having a positive zeta potential.

[Preparation of CMP Polishing Solutions (19)-(29)]

After adding 0.1 part by mass of 1H-1,2,3-triazolo[4,5-b]pyridine, 0.5 part by mass of malic acid, 0.5 part by mass of 30% hydrogen peroxide water, 0.1 part by mass of polymethacrylic acid (weight-average molecular weight: 8000) and 2.0 parts by mass of isopropyl alcohol to 71.8 parts by mass of water, the mixture was stirred and mixed. Also, 25.0 parts by mass of each of colloidal silicas A-K listed in Table 4 (nonvolatile content (NV): 20 mass %, corresponding to 5.0 parts by mass as silica) was added to the mixture, and the mixture was stirred and mixed to prepare CMP polishing solutions (19)-(29).

Colloidal silicas A-K listed in Table 4 are commercially available colloidal silicas, and their zeta potentials in the CMP polishing solutions were altered by combining ones with different zeta potentials. The zeta potentials listed in Table 4 are the values of the zeta potentials in the CMP polishing solution.

[Evaluation of CMP Polishing Solutions (19)-(29)]

CMP polishing solutions (19)-(29) were evaluated by the same procedure as the evaluation of CMP polishing solutions (1)-(18). The results are shown in Table 4. The relationship between zeta potential of abrasive grain and amount of seam is shown in FIG. 3.

TABLE 4

|  |  | CMP Polishing solution | Abrasive particles | Zeta potential (mV) | Mean particle size (nm) | Amount of seam (Å) |
|---|---|---|---|---|---|---|
| Example | 7 | (19) | Colloidal silica A | +21 | 75 | 90 |
|  | 8 | (20) | Colloidal silica B | +20 | 48 | 70 |
|  | 9 | (21) | Colloidal silica C | +20 | 74 | 70 |
|  | 10 | (22) | Colloidal silica D | +14 | 80 | 140 |
|  | 11 | (23) | Colloidal silica E | +12 | 39 | 90 |
|  | 12 | (24) | Colloidal silica F | +11 | 52 | 150 |
|  | 13 | (25) | Colloidal silica G | +6 | 24 | 140 |
|  | 14 | (26) | Colloidal silica H | +1 | 68 | 230 |
| Comp. Ex. | 13 | (27) | Colloidal silica I | −2 | 24 | 440 |
|  | 14 | (28) | Colloidal silica J | −9 | 64 | 550 |
|  | 15 | (29) | Colloidal silica K | −22 | 69 | 570 |

As shown in Table 4 and FIG. 3, the amount of seam was small at not greater than 230 angstrom with the CMP polishing solutions of Examples 7-14 in which the abrasive grains had positive zeta potentials. In Examples 7-14, the amount of seam was further reduced to not greater than 150 angstrom, when the absolute value of the zeta potential was at least 6 mV, in relative comparison to when it was less than 6 mV. A greater absolute value of the zeta potential increases the reducing effect on the amount of seam.

In contrast, with the CMP polishing solutions of Comparative Examples 13-15 wherein the abrasive grains had negative zeta potentials, the amount of seam was at least 440 angstrom, which was about twice the amount with the CMP polishing solution employing abrasive grains with positive zeta potentials.

It was confirmed that an even greater effect of reducing amount of seam is obtained by using the metal corrosion inhibitor containing a compound with a 1,2,3-triazolo[4,5-b]pyridine skeleton together with abrasive grains having a positive zeta potential.

Solubility of Reaction Product Between Copper and Metal Corrosion Inhibitor in Water, and Organic Residue Examples 15-17, Comparative Examples 16-23

The following examples show that organic residue is reduced when the solubility of the reaction product between copper and metal corrosion inhibitor in water is high in a CMP polishing solution employing a metal corrosion inhibitor containing a compound with a 1,2,3-triazolo[4,5-b]pyridine skeleton.

[Preparation of CMP Polishing Solutions (30)-(40)]

After adding 0.5 part by mass of malic acid, 0.2 part by mass of 30% hydrogen peroxide water, 0.05 part by mass of polymethacrylic acid (weight-average molecular weight: 8000), 2.0 parts by mass of isopropyl alcohol and 0.1 part by mass of each metal corrosion inhibitor listed in Table 5 to 72.15 parts by mass of water, the mixture was stirred and mixed. Also, 25.0 parts by mass of commercially available colloidal silica (nonvolatile content (NV): 20 mass %, corresponding to 5.0 parts by mass as silica) having a mean particle size of 60 nm and a zeta potential of about 10 mV was added to the mixture, and the mixture was stirred and mixed to prepare CMP polishing solutions (30)-(40).

[Evaluation of CMP Polishing Solutions (30)-(40)]

(Evaluation of Zeta Potential)

The zeta potentials of the abrasive grains of CMP polishing, solutions (30)-(40) were measured using a Zetasizer 3000 HS by Spectris Co., Ltd. As a result, the zeta potentials of CMP polishing solutions (30)-(40) were 8 mV-13 mV.

(Evaluation of Reaction Products of Copper and Metal Corrosion Inhibitors)

Measuring solutions were prepared by removing only the colloidal silica from CMP polishing solutions (30)-(40) and adding water in the corresponding mass, and then 0.5 part by mass of copper(II) sulfate was added, the mixture was stirred, and the presence of any precipitate after standing for 1 day and after standing for 7 days was visually examined. The precipitate was the reaction product of copper and the metal corrosion inhibitor, there being observed no deposition when the reaction product dissolves in water, and a solid appearing in the CMP polishing solution when the reaction product does not dissolve in water. The results are shown in Table 5.

The term "after standing for 1 day" means after standing for 24-25 hours after adding the copper sulfate, and "after standing for 7 days" means after standing for 168-169 hours after adding the copper sulfate. Evaluation after standing for 7 days for samples in which precipitation was observed after standing for 1 day was not conducted.

(Preparation of Patterned Substrate)

The copper film at sections other than the concavities (trenches) of a copper wiring-attached patterned substrate having a 12-inch (30.5 cm) diameter (φ) (754 CMP pattern by ATDF: 5000 angstrom-thick interlayer insulating film made of silicon dioxide, having a pattern with a 100 μm copper wiring width, 50% wiring density) were polished by a known CMP method using a copper film polishing solution, to expose the barrier layer on the convexities at the surface to be polished. The barrier layer of the patterned substrate was a tantalum film with a thickness of 250 angstrom.

(Polishing Conditions)

Polishing apparatus: Polishing apparatus for 12-inch wafer (trade name: Reflexion LK by Applied Materials, Inc.)

Abrasive cloth: Suede polyurethane wet foam type abrasive cloth.

Platen rotational speed: 90 rpm

Polishing pressure: 10.5 kPa

Polishing solution supply rate: 300 ml/min.

(Substrate Polishing Step)

CMP polishing solutions (30)-(40) were used for chemical mechanical polishing of the patterned substrate for 60 seconds under the polishing conditions described above. In this polishing step, corresponding to the second polishing step described above, the convexities of the interlayer insulating film were all exposed at the surface to be polished at 20 seconds, and the surface to be polished including the exposed convexities of the interlayer insulating film was polished during the remaining 40 seconds.

(Evaluation of Number of Defects)

A wafer defect examination device (trade name: ComPLUS 3T by Applied Materials, Inc.) was used to measure the number of defects at the entire polished surface of the patterned substrate after polishing. The results are shown in Table 5. A defect count of not greater than 300/wafer was evaluated as a satisfactory result.

(Evaluation of Amount of Seam)

A section of the polished patterned substrate with a 100 μm copper wiring width and a 50% wiring density was scanned with a contact profilometer (trade name: P-16. OF by KLA-Tencor), and the amount of excess polishing of the edge section of the interlayer insulating film near the copper wiring compared to the center section of the interlayer insulating film (amount of seam) was measured. The results are shown in Table 5.

TABLE 5

| | | CMP Polishing solution | Metal corrosion inhibitor | Deposition of reaction product of metal corrosion preventer and Cu | | Number of defects (/wafer) | Amount of seam (Å) |
|---|---|---|---|---|---|---|---|
| | | | | After 1 day standing | After 7 days standing | | |
| Example | 15 | (30) | 1H-1,2,3-Triazolo[4,5-b]pyridine | No deposition | No deposition | 32 | 100 |
| | 16 | (31) | 1-Acetyl-1H-1,2,3-triazolo[4,5-b]pyridine | No deposition | No deposition | 18 | 90 |
| | 17 | (32) | 3H-1,2,3-Triazolo[4,5-b]pyridin-3-ol | No deposition | Deposition | 282 | 130 |
| Comp. Ex. | 16 | (33) | 3-Amino-5-hydroxypyrazole | Deposition | — | 723 | 330 |
| | 17 | (34) | Benzotriazole | Deposition | — | 695 | 210 |
| | 18 | (35) | 1,2,4-Triazole | Deposition | — | 543 | 360 |
| | 19 | (36) | 2-Aminopyridine | Deposition | — | 638 | 500 |
| | 20 | (37) | Phthalazine | Deposition | — | 751 | 290 |
| | 21 | (38) | 1-Hydroxybenzotriazole | No deposition | No deposition | 22 | 300 |
| | 22 | (39) | 3-Methyl-5-pyrazolone | No deposition | Deposition | 224 | 350 |
| | 23 | (40) | Aminoguanidine | No deposition | No deposition | 98 | 480 |

As shown in Table 5, the number of defects on the patterned substrate was significantly reduced with a polishing solution in which the reaction product of the copper and metal corrosion inhibitor did not precipitate after standing for 1 day. The effect of reducing the number of defects was even higher with a polishing solution in which the reaction product did not precipitate after standing for 7 days. This means that the cleanability is increased if the reaction product is water-soluble, resulting in reduced organic residue. The reaction products of benzotriazoles that are known as metal corrosion inhibitors are insoluble in water, and they resulted in numerous defects.

In CMP polishing solutions (30)-(32), that each employed a metal corrosion inhibitor containing a compound with a 1,2,3-triazolo[4,5-b]pyridine skeleton, the amount of seam was reduced to not greater than 130 angstrom, while the number of defects was also reduced. With CMP polishing solutions (30) and (31), the amount of seam and number of defects were especially favorable and were simultaneously reduced.

This demonstrated that using an abrasive grain having a positive zeta potential in the CMP polishing solution together with a compound having a 1,2,3-triazolo[4,5-b]pyridine skeleton as the metal corrosion inhibitor can not only significantly reduce the amount of seam, but can also reduce the number of defects (organic residue).

What is claimed is:

1. A polishing method comprising
   a first polishing step of polishing a conductive substance layer of a substrate comprising an interlayer insulating film having an elevated section and a trench at a surface, a barrier layer formed following the surface of the interlayer insulating film and the conductive substance layer formed covering the barrier layer, to expose the barrier layer located on the elevated section of the interlayer insulating film,
   a step of preparing a CMP polishing slurry comprising (A) a metal corrosion inhibitor containing a compound with a 1,2,3-triazolo[4,5-b]pyridine skeleton, (B) an abrasive grain having a zeta potential of +6 mV to +30 mV in the CMP polishing slurry, (C) a metal oxide solubilizer and (D) an oxidizing agent, and
   a second polishing step of polishing the barrier layer exposed in the first polishing step using the CMP polishing slurry to expose the elevated section of the interlayer insulating film,
   wherein (B) the abrasive grain comprises colloidal silica, and
   at least the barrier layer and the interlayer insulating film are polished to remove a portion of the barrier layer and a portion of the interlayer insulating film after the elevated section of the interlayer insulating film is exposed.

2. The method according to claim 1, wherein the interlayer insulating film is at least one film selected from among silicon-based coating films and organic polymer films.

3. The method according to claim 1, wherein the conductive substance layer comprises at least one compound selected from among copper, copper alloys, copper oxides and copper alloy oxides.

4. The method according to claim 1, wherein the barrier layer comprises at least one compound selected from among tungsten compounds, tantalum compounds, titanium compounds, ruthenium compounds and cobalt compounds.

5. The method according to claim 1, wherein the barrier layer comprises a tantalum compound.

6. The method according to claim 1, wherein the component (A) is at least one compound selected from among 1-acetyl-1H-1,2,3-triazolo[4,5-b]pyridine, 1H-1,2,3-triazolo[4,5-b]pyridine and 3H-1,2,3-triazolo[4,5-b]pyridine-3-ol.

7. The method according to claim 1, wherein the component (A) is at least one compound selected from among 1-acetyl-1H-1,2,3-triazolo[4,5-b]pyridine and 1H-1,2,3-triazolo[4,5-b]pyridine.

8. The method according to claim 1, wherein a content of the component (A) is 0.001-10 parts by mass with respect to 100 parts by mass of the CMP polishing slurry.

9. The method according to claim 1, wherein the component (C) is at least one compound selected from among organic acids, organic acid esters, organic acid ammonium salts, inorganic acids and inorganic acid ammonium salts.

10. The method according to claim 1, wherein the component (D) is at least one compound selected from among hydrogen peroxide, periodic acid salts, persulfuric acid salts, hypochlorous acid salts and ozone water.

11. The method according to claim 1, wherein the CMP polishing slurry further comprises (E) a water-soluble polymer.

12. The method according to claim 11, wherein the component (E) is at least one compound selected from among polycarboxylic acids, polycarboxylic acid salts, polycarboxylic acid esters, polysaccharides and vinyl-based polymers.

13. The method according to claim 1, wherein the CMP polishing slurry further comprises (F) an organic solvent.

14. The method according to claim 13, wherein the component (F) is at least one compound selected from among carbonic acid esters, lactones, glycols and glycol derivatives, ethers, alcohols, ketones, phenols, amides and sulfolanes.

15. The method according to claim 13, wherein the component (F) is at least one compound selected from among carbonic acid esters, lactones, glycols and glycol derivatives, ethers, ketones, phenols, amides, n-methylpyrrolidone, ethyl lactate, and sulfolanes.

16. The method according to claim 1, wherein no deposition of a reaction product is observed after removing the component (B) from the CMP polishing slurry and adding water in a corresponding mass to prepare a measuring solution, adding 0.5 parts by mass of copper (II) sulfate with respect to 100 parts by mass of the measuring solution to obtain a mixture, stirring the mixture, and standing for 1 day.

17. The method according to claim 1, wherein (B) the abrasive grain has a zeta potential of +6 mV to +21 mV in the CMP polishing slurry.

18. A polishing method comprising
a step of preparing a substrate comprising an interlayer insulating film and a barrier layer,
a step of preparing a CMP polishing slurry comprising (A) a metal corrosion inhibitor containing a compound with a 1,2,3-triazolo[4,5-b]pyridine skeleton, (B) an abrasive grain having a zeta potential of +6 mV to +30 mV in the CMP polishing slurry, (C) a metal oxide solubilizer and (D) an oxidizing agent, and
a polishing step of polishing at least the barrier layer and the interlayer insulating film using the CMP polishing slurry to remove a portion of the barrier layer and a portion of the interlayer insulating film,
wherein (B) the abrasive grain comprises colloidal silica.

19. The method according to claim 18, wherein at least a portion of the interlayer insulating film is removed in the polishing step.

20. The method according to claim 18, wherein the substrate further comprises a conductive substance layer, and
at least a portion of the conductive substance layer is removed in the polishing step.

21. The method according to claim 20, wherein the conductive substance layer comprises at least one compound selected from among copper, copper alloys, copper oxides and copper alloy oxides.

22. The method according to claim 18, wherein the interlayer insulating film is at least one film selected from among silicon-based coating films and organic polymer films.

23. The method according to claim 18, wherein the barrier layer comprises at least one compound selected from among tungsten compounds, tantalum compounds, titanium compounds, ruthenium compounds and cobalt compounds.

24. The method according to claim 18, wherein the barrier layer comprises a tantalum compound.

25. The method according to claim 18, wherein the component (A) is at least one compound selected from among 1-acetyl-1H-1,2,3-triazolo[4,5-b]pyridine, 1H-1,2,3-triazolo[4,5-b]pyridine and 3H-1,2,3-triazolo[4,5-b]pyridine-3-ol.

26. The method according to claim 18, wherein the component (A) is at least one compound selected from among 1-acetyl-1H-1,2,3-triazolo[4,5-b]pyridine and 1H-1,2,3-triazolo[4,5-b]pyridine.

27. The method according to claim 18, wherein a content of the component (A) is 0.001-10 parts by mass with respect to 100 parts by mass of the CMP polishing slurry.

28. The method according to claim 18, wherein the component (C) is at least one compound selected from among organic acids, organic acid esters, organic acid ammonium salts, inorganic acids and inorganic acid ammonium salts.

29. The method according to claim 18, wherein the component (D) is at least one compound selected from among hydrogen peroxide, periodic acid salts, persulfuric acid salts, hypochlorous acid salts and ozone water.

30. The method according to claim 18, wherein the CMP polishing slurry further comprises (E) a water-soluble polymer.

31. The method according to claim 30, wherein the component (E) is at least one compound selected from among polycarboxylic acids, polycarboxylic acid salts, polycarboxylic acid esters, polysaccharides and vinyl-based polymers.

32. The method according to claim 18, wherein the CMP polishing slurry further comprises (F) an organic solvent.

33. The method according to claim 32, wherein the component (F) is at least one compound selected from among carbonic acid esters, lactones, glycols and glycol derivatives, ethers, alcohols, ketones, phenols, amides and sulfolanes.

34. The method according to claim 32, wherein the component (F) is at least one compound selected from among carbonic acid esters, lactones, glycols and glycol derivatives, ethers, ketones, phenols, amides, n-methylpyrrolidone, ethyl lactate, and sulfolanes.

35. The method according to claim 18, wherein no deposition of a reaction product is observed after removing the component (B) from the CMP polishing slurry and adding water in a corresponding mass to prepare a measuring solution, adding 0.5 part by mass of copper (II) sulfate with respect to 100 parts by mass of the measuring solution to obtain a mixture, stirring the mixture, and standing for 1 day.

36. The method according to claim 18, wherein (B) the abrasive grain has a zeta potential of +6 mV to +21 mV in the CMP polishing slurry.

* * * * *